(12) United States Patent
Xu

(10) Patent No.: US 11,489,443 B2
(45) Date of Patent: Nov. 1, 2022

(54) CHARGE PUMP CIRCUIT

(71) Applicant: CHANGXIN MEMORY TECHNOLOGIES, INC., Anhui (CN)

(72) Inventor: Haining Xu, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/445,598

(22) Filed: Aug. 21, 2021

(65) Prior Publication Data

US 2021/0408900 A1 Dec. 30, 2021

Related U.S. Application Data

(63) Continuation of application No. PCT/CN2021/078436, filed on Mar. 1, 2021.

(30) Foreign Application Priority Data

Mar. 12, 2020 (CN) .......................... 202010170686.4

(51) Int. Cl.
*H02M 3/07* (2006.01)
*H03L 7/093* (2006.01)

(52) U.S. Cl.
CPC .............. *H02M 3/07* (2013.01); *H03L 7/093* (2013.01)

(58) Field of Classification Search
CPC .......... H02M 3/07; H02M 3/073; H02M 3/06; H02M 3/04; H02M 3/02; H02M 3/00; H02M 3/1563; H02M 3/1566; H02M 3/156; H02M 3/155; H02M 3/145; H02M 3/10; H03L 7/097; H03L 7/093; H03L 7/085; H03L 7/08; H03L 7/06
See application file for complete search history.

(56) References Cited

U.S. PATENT DOCUMENTS 8,692,608 B2 4/2014 Chen

FOREIGN PATENT DOCUMENTS

| CN | 1882895 | A | 12/2006 |
|---|---|---|---|
| CN | 101621248 | A | 1/2010 |
| CN | 102130584 | A | 7/2011 |
| CN | 104518663 | A | 4/2015 |
| CN | 105071654 | A | 11/2015 |
| CN | 105468075 | A | 4/2016 |
| CN | 105515370 | A | 4/2016 |
| CN | 105915046 | A | 8/2016 |
| CN | 107294376 | A | 10/2017 |
| CN | 107707115 | A | 2/2018 |
| EP | 3319216 | A1 | 5/2018 |

OTHER PUBLICATIONS

International Search Report in Application No. PCT/CN2021/078436 dated May 26, 2021.
CN first office action in Application No. 202010170686.4, dated Jun. 2, 2022.

*Primary Examiner* — Diana J. Cheng
(74) *Attorney, Agent, or Firm* — Syncoda LLC; Feng Ma

(57) ABSTRACT

A charge pump circuit includes: a charge pump core circuit configured to generate an output voltage, an oscillator configured to provide a clock signal for the charge pump core circuit, and a feedback circuit configured to control the oscillator based on the output voltage, wherein the feedback circuit includes an inner loop.

6 Claims, 4 Drawing Sheets

CHARGE PUMP CIRCUIT

CROSS-REFERENCE TO RELATED APPLICATIONS

This is a continuation of International Patent Application No. PCT/CN2021/078436 filed on Mar. 1, 2021, which claims priority to Chinese Patent Application No. 202010170686.4 filed on Mar. 12, 2020. The disclosures of these applications are hereby incorporated by reference in their entirety.

BACKGROUND

Charge pump circuits are widely applied in various electronic chips, such as memory, display driver and other electronic chips. The charge pump, also known as a switched-capacitor voltage converter, which is a converter for storing energy with a so-called "flying" or "pumping" capacitor, and may increase or decrease an input voltage and may also be used to generate negative voltages. In addition, an internal switch array in the charge pump may control charging and discharging of the flying capacitor in a certain way, such that the input voltage is multiplied or reduced by a certain factor, thereby acquiring an output voltage as required.

SUMMARY

The present disclosure relates generally to the field of integrated circuit technologies, and more specifically to a charge pump circuit.

The present disclosure provides a charge pump circuit, which can output an output voltage with ripples of reduced magnitude.

In an aspect of the present disclosure, a charge pump circuit is provided. The charge pump circuit includes:

a charge pump core circuit, configured to generate an output voltage;

an oscillator, configured to provide a clock signal for the charge pump core circuit; and a feedback circuit, configured to control the oscillator based on the output voltage, wherein the feedback circuit includes an inner loop.

In the technical solution of various embodiments of the present disclosure, the feedback circuit is provided with an internal loop, such that the internal loop can dynamically adjust a sampling value of a voltage at an output terminal of the charge pump core circuit via a control signal output to the oscillator and in turn adjust activating and disactivating time of the charge pump core circuit, thereby achieving an object of adjusting ripples in the voltage output by the charge pump via the internal loop and reducing magnitude of the ripple in the voltage output by the charge pump.

BRIEF DESCRIPTION OF THE DRAWINGS

A reference may be made to one or more figures of the accompanying drawings to better describe and illustrate embodiments of the present disclosure. However, the additional details or examples for describing the accompanying drawings shall not be considered as a limitation on scope of any of the disclosure, the embodiments as described currently, or the preferred examples of the present disclosure.

DETAILED DESCRIPTION

In order to better understand the object, technical solutions, and technical effects of the present disclosure, the present disclosure will be further explained below with reference to the accompanying drawings and embodiments. It shall be noted that the embodiments described below are only for explaining rather than limiting the present disclosure.

Unless otherwise defined, all technical and scientific terms used herein have the same meaning as conventionally understood by those skilled in the field of the present disclosure. The terms in the specification of the present disclosure are only for the purpose of describing specific embodiments, and is not intended to limit the present disclosure. The term "and/or" as used herein includes any and all combinations of one or more related listed items.

In the case of using "comprising", "having", and "including" herein, another component or method may be added unless explicit qualifiers are used, such as "only", "consisting of", and the like. Unless mentioned to the contrary, terms in the singular form may include the plural form, and is not to be understood as having one in number.

As a typical charge pump circuit is essentially a switching power supply, ripples may inevitably occur in the output voltage.

Ripples in the output voltage of a charge pump circuit can be relatively large, and such a circuit is no longer suitable for some occasions where requirements on the output voltage is relatively high.

Figure 1:
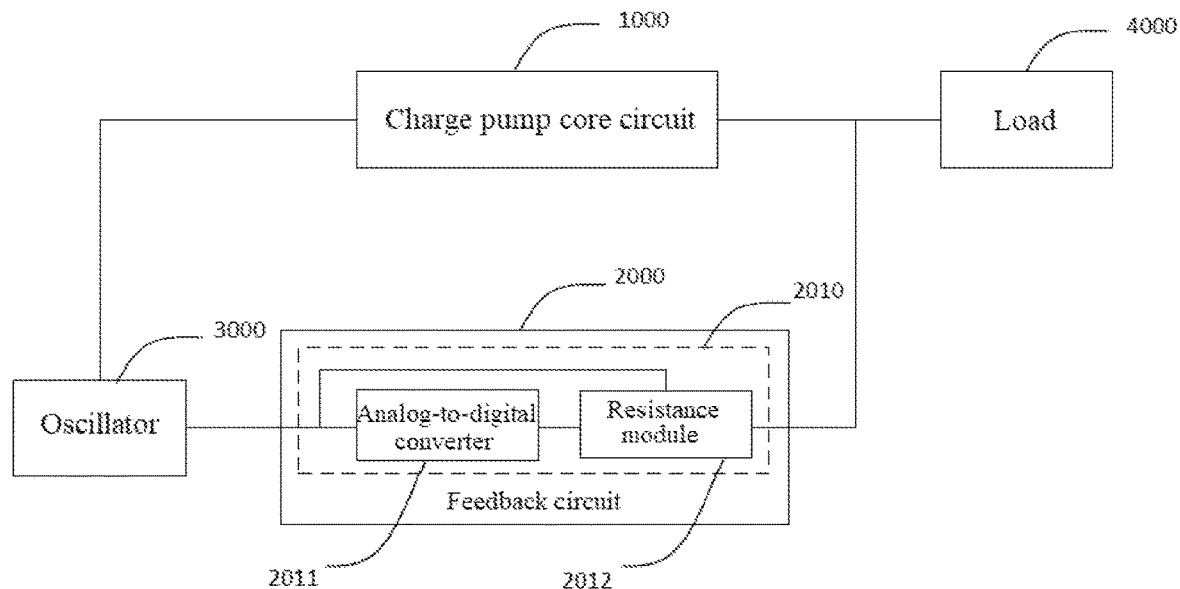
FIG. 1 is a structural block diagram of a charge pump circuit according to some embodiments of the present disclosure.

As shown in FIG. 1, various embodiments of the present disclosure provide a charge pump circuit, which includes a charge pump core circuit 1000, an oscillator 3000 and a feedback circuit 2000. The charge pump core circuit 1000 is configured to generate an output voltage Vout and generally includes at least one capacitor and a control switch thereof, and an output terminal of the charge pump core circuit 1000 is generally connected to a load 4000 that is a powered device. The oscillator 3000 is configured to provide a clock signal for the charge pump core circuit 1000. The feedback circuit 2000 is configured to control the oscillator 3000 based on the output voltage, and the feedback circuit 2000 includes an inner loop 2010.

Figure 2:
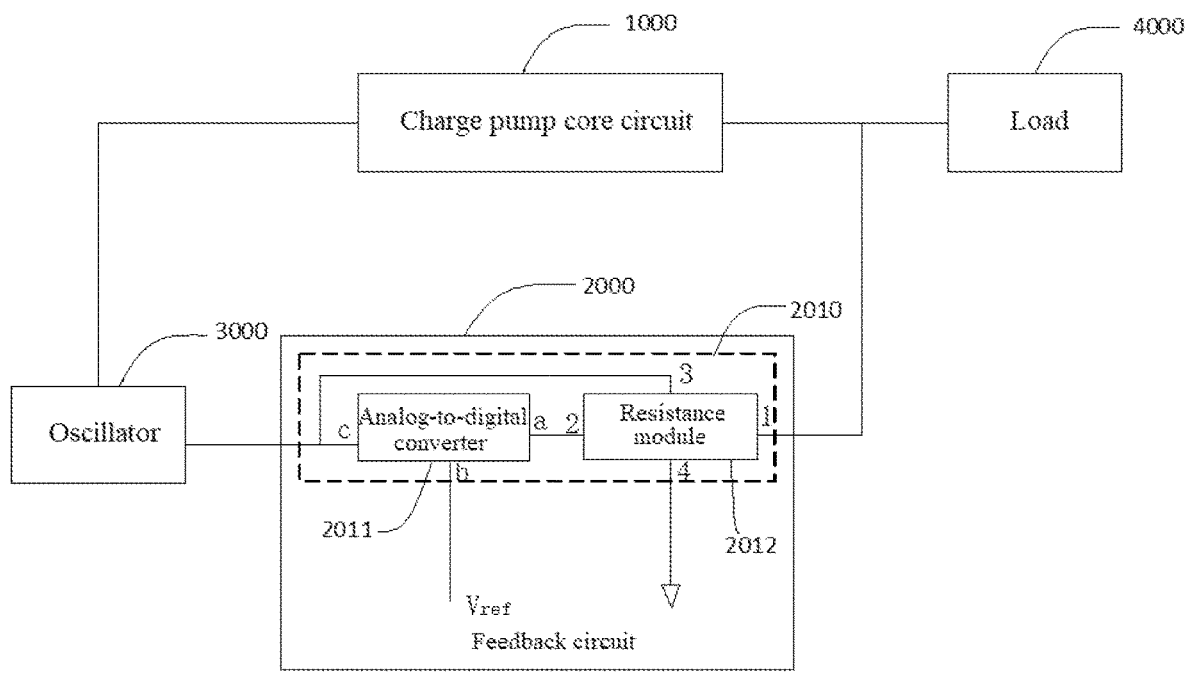
FIG. 2 is a schematic structural diagram of a charge pump circuit wherein an internal loop is formed by an analog-to-digital converter and a resistance module according to an embodiment of the present disclosure.

As shown in FIG. 2, according to an embodiment, the inner loop 2010 in the feedback circuit 2000 may include a resistance module 2012 and an analog-to-digital converter 2011. A second terminal 2 of the resistance module 2012 is connected to a first input terminal "a" of the analog-to-digital converter 2011, and an output terminal c of the analog-to-digital converter 2011 is connected to a third terminal 3 of the resistance module 2012 to form a negative feedback loop. It shall be noted that what is output by the second terminal 2 of the resistance module 2012 may be a feedback voltage that includes, but is not limited to, a divided voltage of the output voltage Vout of the charge pump core circuit 1000 or a voltage proportional to the output voltage Vout. The resistance module 2012 samples the output voltage of the charge pump core circuit 1000, and meanwhile adjusts the feedback voltage at the second terminal "a" according to an output result of the analog-to-digital converter 2011 to achieve an object of controlling the output clock signal of the oscillator 3000, thereby changing ripples of the output voltage of the charge pump core circuit 1000. It shall be noted that, under the aforesaid inventive concept, there are many ways to implement the internal loop 2010 for controlling the oscillator 3000 to output the clock signal, and the internal loop 2010 formed by a combination of the analog-to-digital converter 2011 and the resistance module 2012 is merely one of them.

In the charge pump circuit, a first terminal 1 of the resistance module 2012 is further connected to the output terminal of the charge pump core circuit 1000; a fourth terminal 4 of the resistance module 2012 is further connected to a ground terminal; a second input terminal b of the analog-to-digital converter 2011 is connected to a reference voltage; and the output terminal c of the analog-to-digital converter 2011 is further connected to a control terminal of the oscillator 3000. The reference voltage is generally of a fixed voltage value. In this embodiment, a supply source of the reference voltage may include, but is not limited to, a bandgap reference voltage source.

In an example, the resistance module 2012 may include a fixed resistance and a switch S1. A third terminal 3 of the resistance module 2012 is connected to a control terminal of the switch S1, and an equivalent resistance value of the resistance module 2012 is adjusted by turning on or turning off the switch S1. The switch S1 may include a transmission transistor or a transmission gate, such as one of an NMOS switch, a PMOS switch, or a MOS transmission gate.

The resistance module 2012 includes the aforesaid four terminals. It shall be understood that the feedback voltage at the second terminal of the resistance module 2012 may be adjusted by changing the equivalent resistance value of the resistance module 2012, and examples are as follows.

Figure 3:
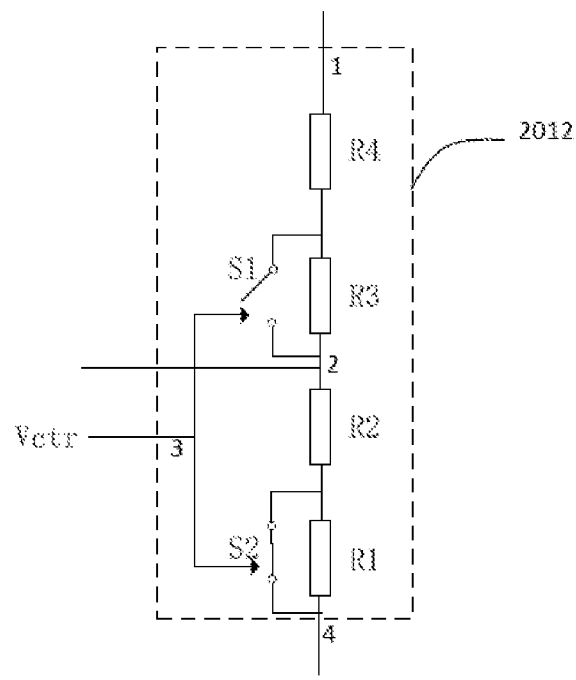
FIG. 3 is a circuit diagram of a resistance module according to an embodiment of the present disclosure when an object of adjusting a feedback voltage is achieved by controlling a first equivalent resistance value with a third terminal of the resistance module.

In an example, assuming that a value of an equivalent resistance formed between the first terminal 1 and the fourth terminal 4 of the resistance module 2012 is a first equivalent resistance value (hereinafter represented by R14), the magnitude of R14 may be controlled through the third terminal 3 of the resistance module 2012 to achieve the object of adjusting the feedback voltage. In the specific implementation shown in FIG. 3, the resistance module 2012 includes a first resistance R1, a second resistance R2, a third resistance R3, and a fourth resistance R4 sequentially connected in series. The first switch S1 correspondingly controls whether to connect the third resistance R3; the second switch S2 correspondingly controls whether to connect the fourth resistance R4; and operation states of the first switch S1 and the second switch S2 at the same time are different. The third terminal 3 of the resistance module 2012 controls the first switch S1 and the second switch S2 simultaneously to adjust the first equivalent resistance value R14, such that a ratio of the feedback voltage to the output voltage may be switched between R2/(R2+R3+R4) and (R1+R2)/(R1+R2+R4) to achieve the object of adjusting the feedback voltage.

Figure 4:
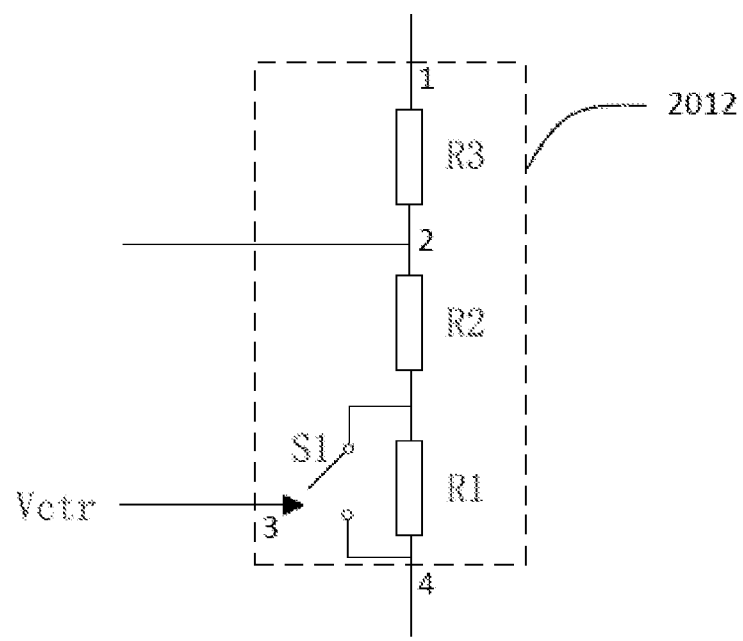
FIG. 4 is a circuit diagram of a resistance module according to an embodiment of the present disclosure when the object of adjusting a feedback voltage is achieved by controlling a third equivalent resistance value with the third terminal of the resistance module.

In another example, assuming that a value of an equivalent resistance formed between the second terminal 2 and the fourth terminal 4 of the resistance module 2012 is a third equivalent resistance value (hereinafter represented by R24), the magnitude of R24 may be controlled through the third terminal 3 of the resistance module 2012 to achieve the object of adjusting the feedback voltage. For example, in the specific implementation shown in FIG. 4, the resistance module 2012 includes a first resistance R1, a second resistance R2, and a third resistance R3 sequentially connected in series. The first switch S1 correspondingly controls whether to connect the first resistance R1, and the third terminal 3 of the resistance module 2012 controls the first switch S1 to adjust the third equivalent resistance value R24, such that a ratio of the feedback voltage to the output voltage may be switched between (R1+R2)/(R1+R2+R3) and R2/(R2+R3) to achieve the object of adjusting the feedback voltage.

Figure 5:
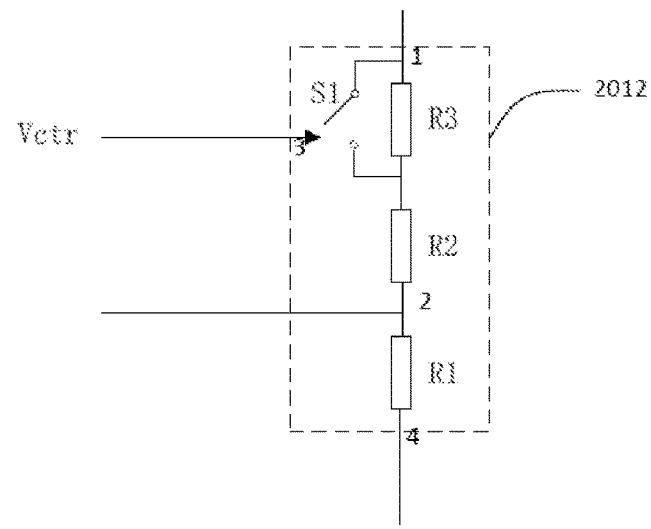
FIG. 5 is a circuit diagram of a resistance module according to an embodiment of the present disclosure when the object of adjusting a feedback voltage is achieved by controlling a second equivalent resistance value with the third terminal of the resistance module.

In still another example, assuming that a value of an equivalent resistance formed between the first terminal 1 and the second terminal 2 of the resistance module 2012 is a second equivalent resistance value (hereinafter represented by R12), the magnitude of R12 may be controlled through the third terminal 3 of the resistance module 2012 to achieve the object of adjusting the feedback voltage. In the specific implementation shown in FIG. 5, the resistance module 2012 includes a first resistance R1, a second resistance R2, and a third resistance R3 sequentially connected in series. The first switch S1 correspondingly controls whether to connect the third resistance R3, and the third terminal 3 of the resistance module 2012 controls the first switch S1 to adjust the second equivalent resistance value R12, such that a ratio of the feedback voltage to the output voltage may be switched between R1/(R1+R2+R3) and R1/(R1+R2) to achieve the object of adjusting the feedback voltage.

It shall be noted that the analog-to-digital converter 2011 may be implemented in many ways and may for example be implemented by, but not limited to, a comparator. In some examples, the number of comparators and the cascading manner of comparators may be further designed accordingly to further increase the data processing amount and thereby improve working accuracy of various embodiments of the present disclosure. In a specific embodiment, the analog-to-digital converter 2011 includes a comparator 2011a. A first input terminal, a second input terminal, and an output terminal of the comparator 2011a serve as the first input terminal, the second input terminal, and the output terminal of the analog-to-digital converter 2011, respectively.

Figure 6:
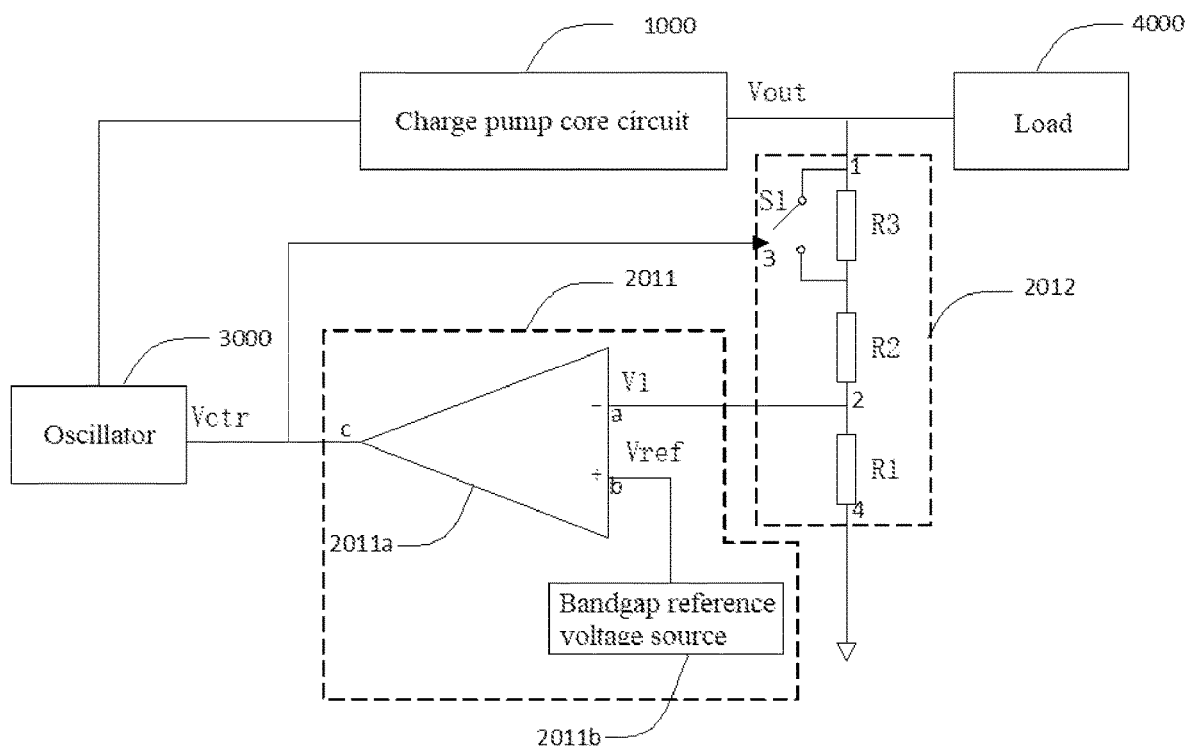
FIG. 6 is a circuit diagram of a charge pump circuit according to an embodiment of the present disclosure when the object of adjusting a feedback voltage is achieved by controlling a second equivalent resistance value with the third terminal of a resistance module.

Next, the working principle of various embodiments of the present disclosure and the technical effects as achieved are further explained in conjunction with a specific circuit shown in FIG. 6. In this embodiment, the fixed resistance includes a first resistance R1, a second resistance R2, and a third resistance R3. Endpoints 1, 2, 3, and 4 in FIG. 6 represent the first terminal, second terminal, third terminal, and fourth terminal of the resistance module 2012, respectively. That is, a terminal of the third resistance R3 is the first terminal of the resistance module; the other terminal of the third resistance R3 is connected to a terminal of the second resistance R2; the other terminal of the second resistance R2 is connected to a terminal of the first resistance R1 and serves as the second terminal of the resistance module 2012; the other terminal of the first resistance R1 is the fourth terminal of the resistance module 2012; a terminal of the first switch S1 is the first terminal of the resistance module 2012; the other terminal of the first switch S1 is connected to the other terminal of the third resistance R3 to connect the first switch S1 and the third resistance R3 in parallel; and the control terminal Vctr of the first switch S1 is the third terminal 3 of the resistance module 2012. In this embodiment, the analog-to-digital converter 2011 includes one comparator 2011a. A first input terminal "a" of the comparator 2011a is a negative terminal for inputting the feedback voltage V1 of the second terminal 2 of the resistance module 2012, and a second input terminal b of the comparator 2011a is a positive terminal for inputting the reference voltage Vref. The comparator 2011a is configured to compare input voltages of the positive terminal and negative terminal, and output a comparison result.

Figure 7:
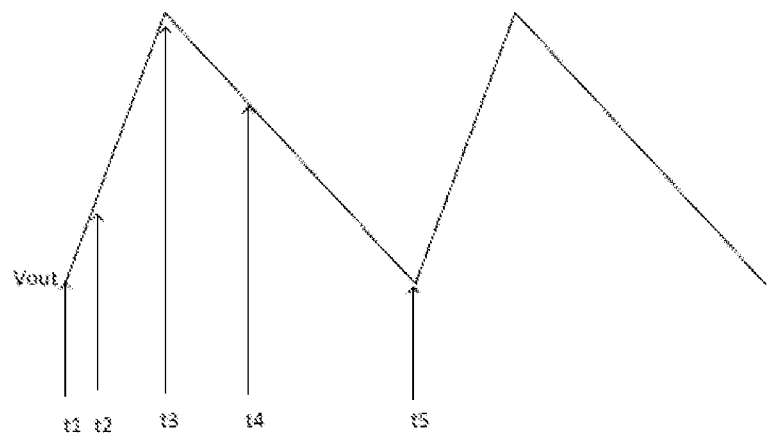
FIG. 7 is an output voltage waveform diagram of an output voltage Vout according to the present disclosure when the charge pump circuit shown in FIG. 6 has no inner loop.
Figure 8:
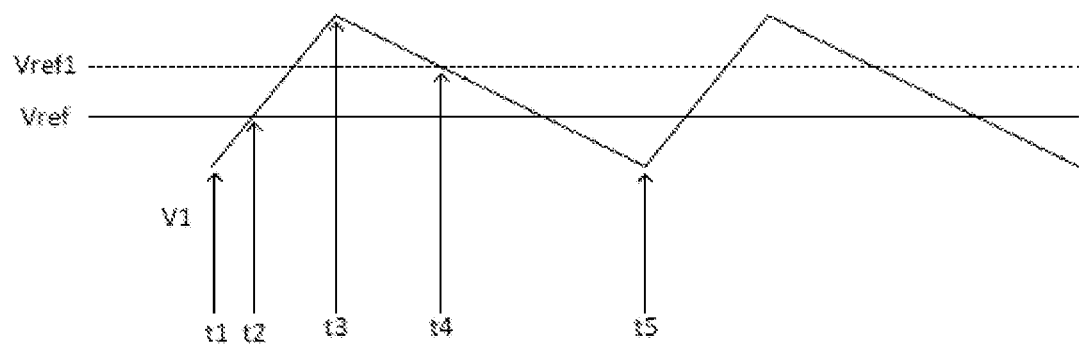
FIG. 8 is a schematic diagram of a voltage waveform relationship between a reference voltage Vref and a feedback voltage V1 according to the present disclosure when the charge pump circuit shown in FIG. 6 has no inner loop.

FIG. 7 is an output voltage waveform diagram of the output voltage Vout when the charge pump circuit has no inner loop; and FIG. 8 is a schematic diagram of a voltage waveform relationship between the feedback voltage V1 and the reference voltage Vref when the charge pump circuit has no internal loop. The working principle of the charge pump circuit are explained herein in conjunction with FIG. 7 and FIG. 8.

Vout may go through two stages while rising from a valley to a peak. The duration from t1 to t2 is a valley-to-peak transition stage, and the duration from t2 to t3 is a valley-to-peak transition delay stage. In the duration from t1 to t2, Vctr has a high level 1 and controls the oscillator 3000 to work normally, such that the oscillator 3000 outputs a driving clock signal to the charge pump core circuit 1000, and Vctr meanwhile controls to turn on the switch S1. At this stage, V1=Vout*R1/(R1+R2). Then, Vout continues to rise until V1 is equal to Vref, and the comparator 2011a reaches a critical reversing point. The comparator 2011a has a delay characteristic. Thus, although V1 is equal to Vref at t2, the output Vctr of the comparator 2011a may not immediately change from high level 1 to low level 0, but continues to maintain at high level 1 until arriving at t3.

Vout may go through two stages while descending from the peak to valley. The duration from t3 to t4 is a peak-to-valley transition stage, and the duration from t4 to t5 is a peak-to-valley transition delay stage. In the duration from t3 to t4, Vctr reverse to have a low level 0, and meanwhile deactivate the oscillator 3000 and turn off the first switch S1, such that the oscillator 3000 stops working. At this stage, V1=Vout*R1/(R1+R2). Then, Vout continues to descend until V1 is equal to Vref, and the comparator 2011a reaches a critical reversing point. The comparator 2011a has a delay characteristic. Thus, although V1 is equal to Vref at t4, the output Vctr of the comparator 2011a may not immediately change from low level 0 to high level 1, but continues to maintain at low level 0 until arriving at t5.

Afterwards, the charge pump circuit repeats the working principle from t1 to t5. It shall be pointed out that a ratio of the feedback voltage to the output voltage from t1 to t3 is R1/(R1+R2), and a ratio of the feedback voltage to the output voltage from t3 to t5 is R1/(R1+R2+R3), such that the feedback voltage may get closer to the Vref voltage faster, and the comparator 2011a may reverse faster, thereby enabling the oscillator 3000 to enter the active state from the inactive state faster. Consequently, the charge pump core circuit 1000 may resume the normal active state from the inactive state faster, thereby reducing the voltage drop of the output voltage Vout from a peak to a valley and reducing the magnitude of ripples of the output voltage Vout.

It shall be understood that the aforesaid embodiment is implemented by adjusting the feedback voltage V1. As shown in FIG. 8, it is also possible to make some transformation based on the aforesaid inventive concept. For example, it may be implemented in another example by adjusting the reference voltage instead of the feedback voltage V1. Specifically, the reference voltage may be raised to Vref1 (Vref1>Vref) from t3 to t4, which may also achieve the object of reducing the magnitude of ripples of the output voltage Vout by enabling the feedback voltage V1 to get closer to the reference voltage faster.

Technical features of the aforesaid embodiments can be employed in arbitrary combinations. In order to make the description concise, all possible combinations of respective technical features of the aforesaid examples are not described, which, however, shall be regarded as in the scope of this specification as long as no contradiction occurs in the combinations of the technical features.

The aforesaid embodiments only express several implementation manners of the present disclosure with a relatively specific and detailed description manner, but they shall not be understood as a limitation on the scope of the present disclosure. It shall be pointed out that a person of ordinary skill in the art may further make several modifications and improvements without departing from the concept of the present disclosure, and the modifications and improvements shall fall within the protection scope of the present disclosure. Therefore, the protection scope of the present disclosure shall be subject to the appended claims.

What is claimed is:

1. A charge pump circuit, comprising:
a charge pump core circuit, configured to generate an output voltage;
an oscillator, configured to provide a clock signal for the charge pump core circuit; and
a feedback circuit, configured to control the oscillator based on the output voltage, wherein the feedback circuit comprises an inner loop;
wherein the inner loop comprises a resistance module and an analog-to-digital converter, a second terminal of the resistance module is connected to a first input terminal of the analog-to-digital converter, and an output terminal of the analog-to-digital converter is connected to a third terminal of the resistance module;
wherein a first terminal of the resistance module is connected to an output terminal of the charge pump core circuit; a fourth terminal of the resistance module is connected to a ground terminal; and the output terminal of the analog-to-digital converter is further connected to a control terminal of the oscillator; and
wherein a value of an equivalent resistance formed between the first terminal and the second terminal of the resistance module is a second equivalent resistance value; wherein a value of an equivalent resistance formed between the second terminal and the fourth terminal of the resistance module is a third equivalent resistance value; and at least one of the second equivalent resistance value and the third equivalent resistance value is controlled through the third terminal of the resistance module.

2. The charge pump circuit according to claim 1, wherein a second input terminal of the analog-to-digital converter is connected to a reference voltage.

3. The charge pump circuit according to claim 2, wherein the resistance module comprises a fixed resistance and a switch, the third terminal of the resistance module is connected to a control terminal of the switch, and the equivalent resistance value of the resistance module is adjusted by turning on or turning off the switch.

4. The charge pump circuit according to claim 3, wherein the fixed resistance comprises a first resistance, a second resistance, and a third resistance, and the switch comprises one of an NMOS switch, a PMOS switch, or a MOS transmission gate; a terminal of the third resistance is the first terminal of the resistance module, and another terminal of the third resistance is connected to a terminal of the second resistance; another terminal of the second resistance is connected to a terminal of the first resistance and serves as the second terminal of the resistance module; another terminal of the first resistance is the fourth terminal of the resistance module; a terminal of the switch is the first terminal of the resistance module, and another terminal of the switch is connected to the another terminal of the third resistance to connect the switch and the third resistance in parallel; and a control terminal of the switch is the third terminal of the resistance module.

5. The charge pump circuit according to claim 2, wherein the analog-to-digital converter comprises a comparator, and a first input terminal, a second input terminal, and an output terminal of the comparator serve as the first input terminal, the second input terminal, and the output terminal of the analog-to-digital converter, respectively.

6. The charge pump circuit according to claim 5, wherein the reference voltage is provided by a bandgap reference voltage source.

* * * * *